US008217650B2

(12) United States Patent
Sueoka

(10) Patent No.: US 8,217,650 B2
(45) Date of Patent: Jul. 10, 2012

(54) MAGNETIC RESONANCE IMAGING SYSTEM AND MAGNETIC RESONANCE IMAGING METHOD

(75) Inventor: Kazuhiro Sueoka, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 22 days.

(21) Appl. No.: 12/545,970

(22) Filed: Aug. 24, 2009

(65) Prior Publication Data

US 2010/0052677 A1    Mar. 4, 2010

(30) Foreign Application Priority Data

Aug. 26, 2008    (JP) .................................. 2008-216793

(51) Int. Cl.
*G01V 3/00*    (2006.01)

(52) U.S. Cl. ........................................ 324/309; 324/312

(58) Field of Classification Search .................. 324/309, 324/307, 312

See application file for complete search history.

(56) References Cited

U.S. PATENT DOCUMENTS

| | | | |
|---|---|---|---|
| 6,278,273 B1 * | 8/2001 | Riederer et al. | 324/309 |
| 6,380,740 B1 | 4/2002 | Laub | |
| 6,597,937 B2 * | 7/2003 | Liu et al. | 600/420 |
| 6,914,429 B2 | 7/2005 | Ookawa | |
| 7,423,430 B1 * | 9/2008 | Sharif et al. | 324/309 |
| 7,541,808 B2 * | 6/2009 | Doyle | 324/309 |
| 7,642,776 B2 * | 1/2010 | Moll et al. | 324/307 |
| 7,853,060 B2 * | 12/2010 | Schmitt et al. | 382/128 |

FOREIGN PATENT DOCUMENTS

JP    2004-24783    1/2004

OTHER PUBLICATIONS

Wieben et al., Simulation of Optimized Time-Resolved Segmented Elliptical-Centric 3D Tricks for Abdominal MRA, *Proc. Intl. Soc. Mag. Reson. Med.* 8, 2000, p. 1799.

* cited by examiner

*Primary Examiner* — Louis Arana
(74) *Attorney, Agent, or Firm* — Nixon & Vanderhye PC

(57) ABSTRACT

A magnetic resonance imaging system detects a magnetic resonance signal generated from a sample, repeatedly acquires data on the detected magnetic resonance signal in an imaging period and arranges the acquired data in k space. The data is acquired in one acquisition pattern of a plurality of different acquisition patterns, which are determined so that an acquisition frequency of data in some areas of k space is different from that in the other areas of k space. An image of the sample is repeatedly reconstructed based on the acquired data and arranged in the k space. The acquisition is controlled to change the acquisition pattern during the imaging period.

20 Claims, 12 Drawing Sheets

MAGNETIC RESONANCE IMAGING SYSTEM AND MAGNETIC RESONANCE IMAGING METHOD

CROSS-REFERENCE TO RELATED APPLICATIONS

This application is based upon and claims the benefit of priority from prior Japanese Patent Application No. 2008-216793, filed Aug. 26, 2008, the entire contents of which are incorporated herein by reference.

BACKGROUND OF THE INVENTION

1. Field of the Invention

The present invention relates to a magnetic resonance imaging system and a magnetic resonance imaging method for dynamically imaging using a technique of making a data acquisition frequency for some areas in k space different from that of other areas.

2. Description of the Related Art

A technique of further enhancing the data acquisition frequency for an area closer to the center of k space is known as a technique for improving the effective temporal resolution in contrast MRA (Magnetic Resonance Angiography). This technique is called, for example, TRICKS (Time Resolved Imaging of Contrast Kinetics) or DRKS (Different Rate k-space Sampling). Hereinafter, this technique is referred to as "DRKS".

In DRKS, k space is divided into plural acquisition areas from the center thereof to the outer edge. The data acquisition frequency is more enhanced in the acquisition area closer to the center of the k space. In DRKS, since data on the central area of k space, that is, the low-frequency components of a magnetic resonance signal, can be acquired with a relatively higher frequency, it is possible to dynamically image with higher contrast and higher temporal resolution. In general, the plural acquisition areas are set so that the amounts of acquired data in the acquisition areas are equal to each other. The number of acquisition areas is determined depending on the desired speed-up rate. For example, 1.5 times, 2 times, 3 times and the like are realized as the speed-up rate and the numbers of acquisition areas corresponding to the speed-up rates are 3, 4, 6, and the like, respectively.

DRKS is disclosed in JP-A-2004-24783 (U.S. Pat. No. 6,914,429).

However, in contrast MRA employing DRKS, an image in which a contrast agent flows in a relatively thick blood vessel is drawn out with high contrast. Since the data acquisition frequency for intermediate-frequency to high-frequency components is relatively smaller, it is difficult to image fine blood vessels with high precision.

BRIEF SUMMARY

In view of the above-mentioned situation, there is a need for imaging a target with high temporal resolution and high contrast while also expressing the imaged target with high precision.

According to a first aspect of the invention, there is provided a magnetic resonance imaging system including: detection means for detecting a magnetic resonance signal generated from a sample; acquisition means for repeatedly acquiring data on the magnetic resonance signal detected by the detection means in an imaging period and arranging the acquired data in a k space, wherein the acquisition means acquires the data in one acquisition pattern of a plurality of different acquisition patterns, which are determined so that an acquisition frequency of data in some areas of the k space is different from that in the other areas of the k space; reconstruction means for repeatedly reconstructing an image of the sample on the basis of the data acquired by the acquisition means and arranged in the k space; and control means for controlling the acquisition means to change the acquisition pattern used by the acquisition means during the imaging period.

According to a second aspect of the invention, there is provided a magnetic resonance imaging method including: detecting a magnetic resonance signal generated from a sample; repeatedly acquiring data on the detected magnetic resonance signal in an imaging period and arranging the acquired data in a k space; repeatedly reconstructing an image of the sample on the basis of the data arranged in the k space, and controlling the acquisition of the data so as to acquire the data in one acquisition pattern out of a plurality of different acquisition patterns, which are determined so that an acquisition frequency of data in some areas of the k space is different from that in the other areas of the k space, and to change the acquisition pattern to be used during the imaging period.

Additional objects and advantages of the exemplary embodiments will be set forth in the description which follows, and in part will be obvious from the description, or may be learned from practice. The objects and advantages of the invention may be realized and obtained by means of the exemplary instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the exemplary embodiments.

DETAILED DESCRIPTION

Hereinafter, an embodiment of the invention will be described with reference to the accompanying drawings.

Figure 1:
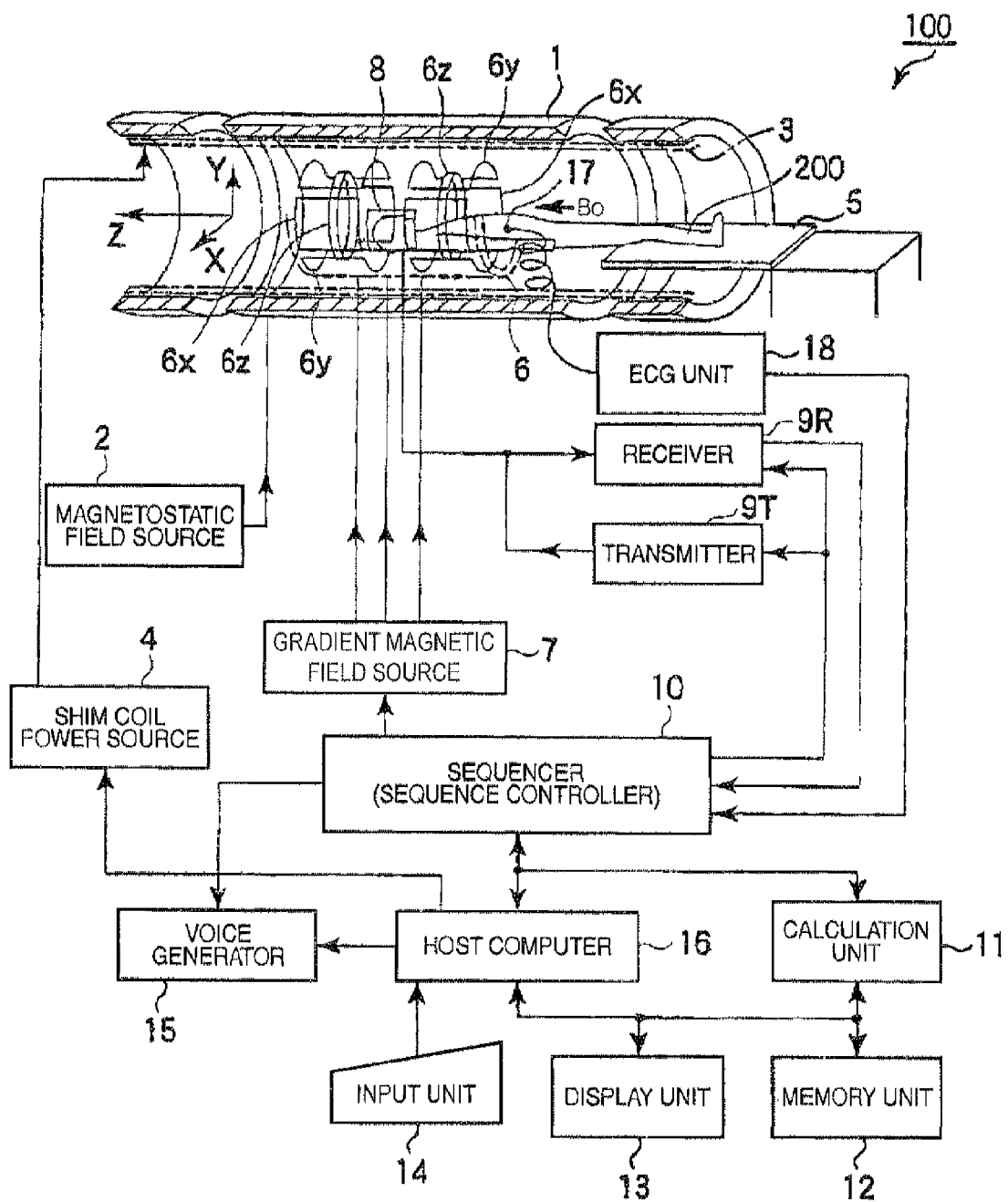
FIG. 1 is a diagram schematically illustrating the configuration of a magnetic resonance imaging (MRI) system according to an embodiment of the invention.

FIG. 1 is a diagram schematically illustrating the configuration of a magnetic resonance imaging (MRI) system 100 according to an embodiment of the invention.

The MRI system 100 includes a bed section onto which a sample 200 is loaded, a magnetostatic field generating section generating a magnetostatic field, a gradient magnetic field generating section adding positional information to a magnetostatic field, a transceiver section transmitting and receiving radio frequency signals, and a control and calculation section controlling the entire system and reconstructing an image. As constituent elements of the sections, the MRI system 100 includes a magnet 1, a magnetostatic field source 2, a shim coil 3, a shim coil power source 4, a top plate 5, a gradient magnetic field coil unit 6, a gradient magnetic field source 7, an RF coil unit 8, a transmitter 9T, a receiver 9R, a sequencer (sequence controller) 10, a calculation unit 11, a memory unit 12, a display unit 13, an input unit 14, a voice generator 15, and a host computer 16. An ECS section measuring an ECG signal as a signal representing a cardiac time phase of a sample 200 is connected to the MRI system 100.

The magnetostatic field generating section includes the magnet 1 and the magnetostatic field source 2. For example, a superconductor magnet or a normal conductor magnet can be used as the magnet 1. The magnetostatic field source 2 supplies a current to the magnet 1. The magnetostatic field generating section generates a magnetostatic field $B_0$ in a cylindrical space (diagnosis space) to which the sample 200 is loaded. The magnetic field direction of the magnetostatic field $B_0$ is substantially parallel to an axis direction (Z axis direction) of the diagnosis space. The magnetostatic field generating section further includes the shim coil 3. The shim coil 3 generates a correcting magnetic field for enhancing the uniformity of the magnetostatic field with the supply of a current from the shim coil power source 4 under the control of the host computer 16.

The bed section serves to load the top plate 5 on which the sample 200 is placed to the diagnosis space or to unload the top plate from the diagnosis space.

The gradient magnetic field generating section includes the gradient magnetic field coil unit 6 and the gradient magnetic field source 7. The gradient magnetic field coil unit 6 is disposed inside the magnet 1. The gradient magnetic field coil unit 6 includes three coils 6x, 6y, and 6z for generating the gradient magnetic fields in an X axis direction, a Y axis direction, and a Z axis direction perpendicular to each other. The gradient magnetic field source 7 supplies pulse currents for generating the gradient magnetic fields to the coil 6x, the coil 6y, and the coil 6z under the control of the sequencer 10. By controlling the pulse currents supplied from the gradient magnetic field source 7 to the coils 6x, 6y, and 6z, the gradient magnetic field generating section synthesizes the gradient magnetic fields in three axis directions (X, Y, and Z axis directions) which are physical axes and arbitrarily sets the gradient magnetic fields in logical axis directions including a gradient magnetic field CS in a slice direction, a gradient magnetic field $G_E$ in a phase encoding direction, and a gradient magnetic field $G_R$ in a reading direction (frequency encoding direction), which are perpendicular to each other. The gradient magnetic fields $G_S$, $G_E$, and $G_R$ in the slice direction, the phase encoding direction, and the reading direction overlap with the magnetostatic field $B_0$.

The transceiver section includes the RF coil unit 8, the transmitter 9T, and the receiver 9R. The RF coil unit 8 is disposed in the vicinity of the sample 200 in the diagnosis space. The transmitter 9T and the receiver 9R are connected to the RF coil unit 8. The transmitter 9T and the receiver 9R operate under the control of the sequencer 10. The transmitter 9T supplies the RF coil unit 8 with an RF current pulse of a Larmor frequency for generating nuclear magnetic resonance (NMR). The receiver 9R receives an MR signal (a radio signal) such as an echo signal detected by the RF coil unit 8, performs various signal processes such as pre-amplification, intermediate frequency transformation, phase detection, low-frequency amplification, and filtering on the input MR signal, and converts the processed signal in an analog-to-digital conversion manner to generate digital data (raw data).

The control and calculation section includes the sequencer 10, the calculation unit 11, the memory unit 12, the display unit 13, the input unit 14, the voice generator 15, and the host computer 16.

The sequencer 10 includes a CPU and a memory. The sequencer 10 stores pulse sequence information sent from the host computer 16 in the memory. The CPU of the sequencer 10 controls the operations of the gradient magnetic field source 7, the transmitter 9T, and the receiver 9R on the basis of the sequence information stored in the memory, once it receives the raw data output from the receiver 9R, and transmits the raw data to the calculation unit 11. Here, the sequence information means all the information necessary for allowing the gradient magnetic field source 7, the transmitter 9T, and the receiver 9R to operate in accordance with a series of pulse sequences and includes, for example, the intensities, the application time, and the application time point of the pulse currents applied to the coils 6x, 6y, and 6z.

The calculation unit 11 receives the raw data output from the receiver 9R via the sequencer 10. The calculation unit 11 arranges the received raw data in k space (also referred to as "Fourier space" or "frequency space") set in its internal memory and reconstructs the data arranged in k space into image data in real space by means of two-dimensional or three-dimensional Fourier transformation. The calculation unit 11 can perform a process of synthesizing the image data or a process of calculating a difference (also including a weight subtraction process) as needed. The synthesizing process includes a process of adding a pixel value of each pixel, a maximum imaging process (MIP), and a minimum imaging process (min IP). In another example of the synthesizing process, axes of plural frames may be matched in Fourier space and raw data of plural frames may be synthesized to obtain raw data of one frame. The adding process may include a simple adding process, an averaging process, or a weighting adding process.

The memory unit 12 stores the raw data, the reconstructed image data, or the image data subjected to the synthesizing process or the subtraction process.

The display unit 13 displays various images to be provided to a user under the control of the host computer 16. A display device such as a liquid crystal display can be used as the display unit 13.

The input unit 14 serves to input a variety of information such as parameter information for selecting a synchronization time point desired by an operator and information on a scanning condition, a pulse sequence, a synthesis of an image or a calculation of a difference. The input unit 14 sends the input information to the host computer 16. The input unit 14 can properly include a pointing device such as a mouse or a track ball, a selection device such as a mode switch, and an input device such as a keyboard.

The voice generator 15 emits breath-holding start and breath-holding end messages as voices when receiving an instruction from the host computer 16.

The host computer 16 generally controls the units of the MRI system 100 so as to perform various operations of the existing MRI system. The host computer 16 further has a function of controlling the change of a data acquisition pattern in DRKS.

The ECG section includes an ECG sensor 17 and an ECG unit 18. The ECG sensor 17 is attached to the body surface of the sample 200 and serves to detect an ECG signal of the sample 200 as an electrical signal (hereinafter, referred to as a "sensor signal"). The ECG unit 18 performs various processes including a digitalization process on the sensor signal and then outputs the processed signal to the host computer 16 and the sequencer 10. For example, a vector electrocardiograph can be used in the ECG section. The sensor signal detected by the ECG section is used by the sequencer 10 as needed when it performs a scanning operation in synchronization with the cardiac time phase of the sample 200.

In the MRI system 100, the RF coil unit 8 serves as the detection means, the gradient magnetic field coil unit 6, the gradient magnetic field source 7, the RF coil unit 8, the transmitter 9T, the receiver 9R, the sequencer 10, and the calculation unit 11 serve as the acquisition means, the calculation unit 11 serves as the reconstruction means and the generation means, and the host computer 16 serves as the control means.

Operations of the MRI system 100 having the above-mentioned configuration will be described now. The MRI system 100 can perform various imaging operations which were performed by prior MRI systems and such various imaging operations will not be described. Operations of performing a contrast MRA imaging process employing DRKS will be described herein. DRKS is a sampling method of setting an acquisition order (excitation order) of pulse sequences and performing a scanning operation so as to acquire more of the data arranged at the center of k space than data arranged in other areas. For example, in three-dimensional scanning, three-dimensional k space is divided into plural segments (acquisition areas) from the center of k space perpendicular to the frequency encoding direction towards the outside of k space. Then, the central segment is scanned more frequently than the other segments and the segments are typically scanned in an elliptical centric order.

Figure 2:
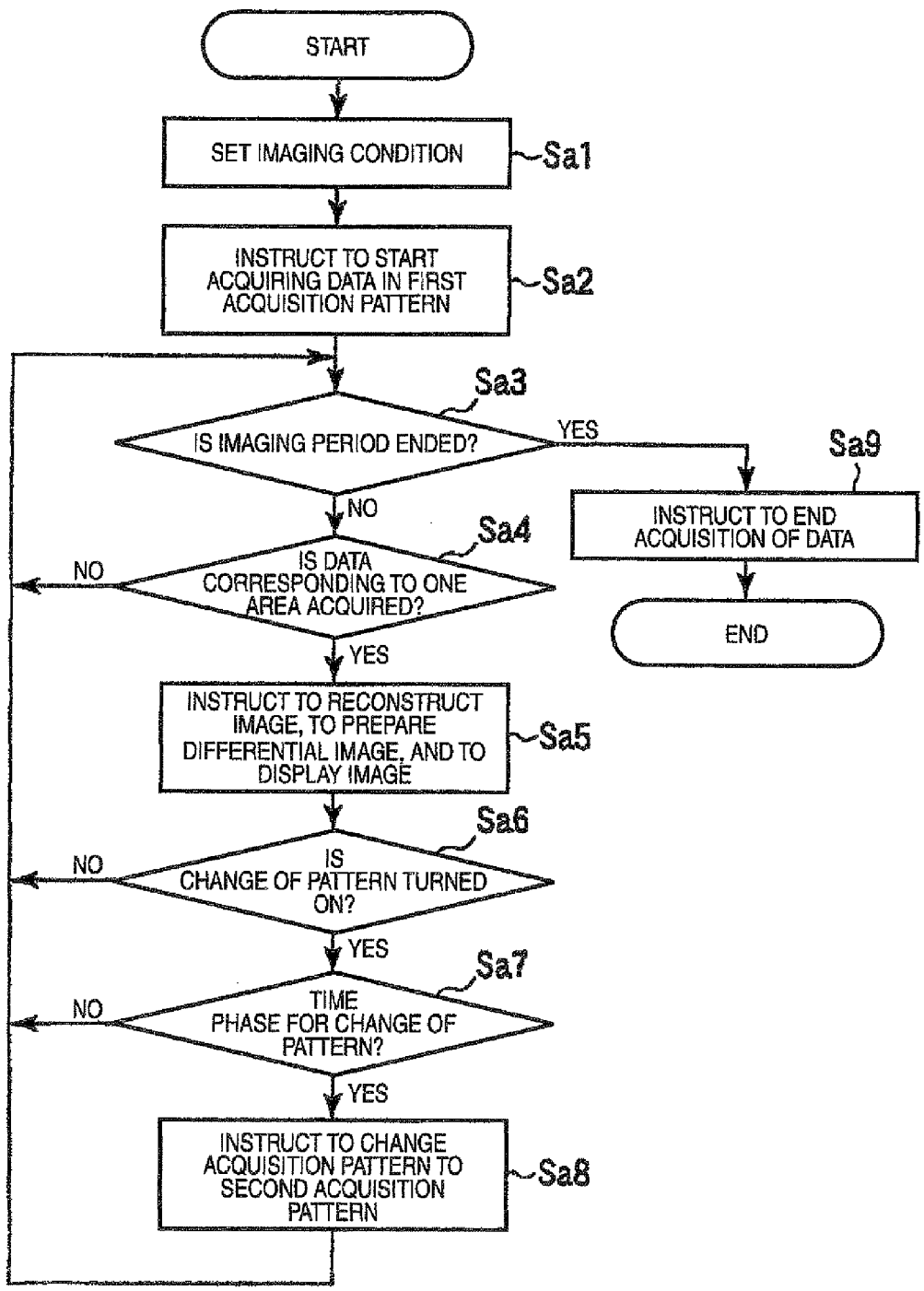
FIG. 2 is a flowchart illustrating a flow of processes performed by a host computer shown in FIG. 1 in the dynamic contrast MRA imaging employing the DRKS.

FIG. 2 is a flowchart illustrating a flow of processes performed by the host computer 16 in contrast MRA dynamic imaging employing DRKS.

Figure 3:
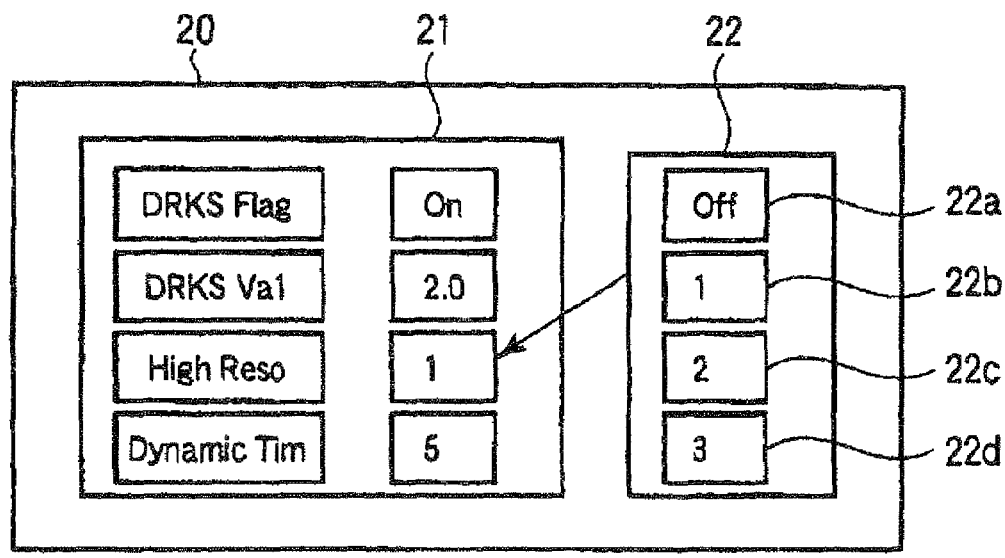
FIG. 3 is a diagram illustrating an example of a setting picture displayed on a display unit shown in FIG. 1.

In step Sa1, the host computer 16 sets various imaging conditions in accordance with a user's instruction. At this time, the host computer 16 sets an ON/OFF state of a change in an acquisition pattern and a time phase to change the acquisition pattern, in addition to known imaging conditions in contrast MRA imaging employing DRKS. Specifically, host computer 16 displays, for example, a setting graphical user interface (GUI) 20 shown in FIG. 3 on the display unit 13. The setting GUI 20 first includes only a setting confirmation 21. When the user instructs a change in an acquisition pattern, host computer 16 adds a setting change GUI 22 to the 20. When button 22a, prepared in the change GUI 22, is selected, the host computer 16 sets the change in a data acquisition pattern to OFF. When one of buttons 22b to 22d prepared in the setting change GUI 22 is selected, host computer 16 sets the change in a data acquisition pattern to ON and sets the time phase corresponding to the selected button as a time phase to change the data acquisition pattern.

Thereafter, the user injects a contrast agent into the sample 200 and instructs the system to start imaging. Then, in step Sa2, host computer 16 instructs sequencer 10 and calculation unit 11 to start acquiring data in the first acquisition pattern. In response to this instruction, sequencer 10 and calculation unit 11 start acquiring data in the first acquisition pattern.

Figure 4:
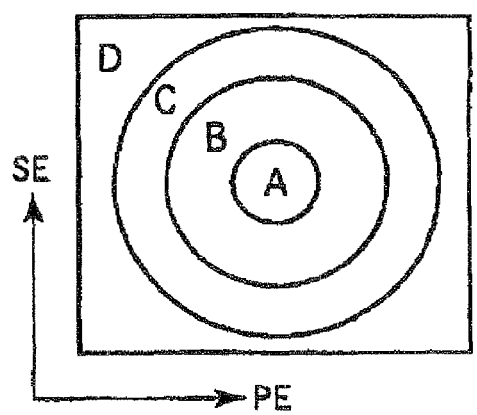
FIG. 4 is a diagram illustrating an example where the k space is divided for the double speed-up DRKS.
Figure 5:
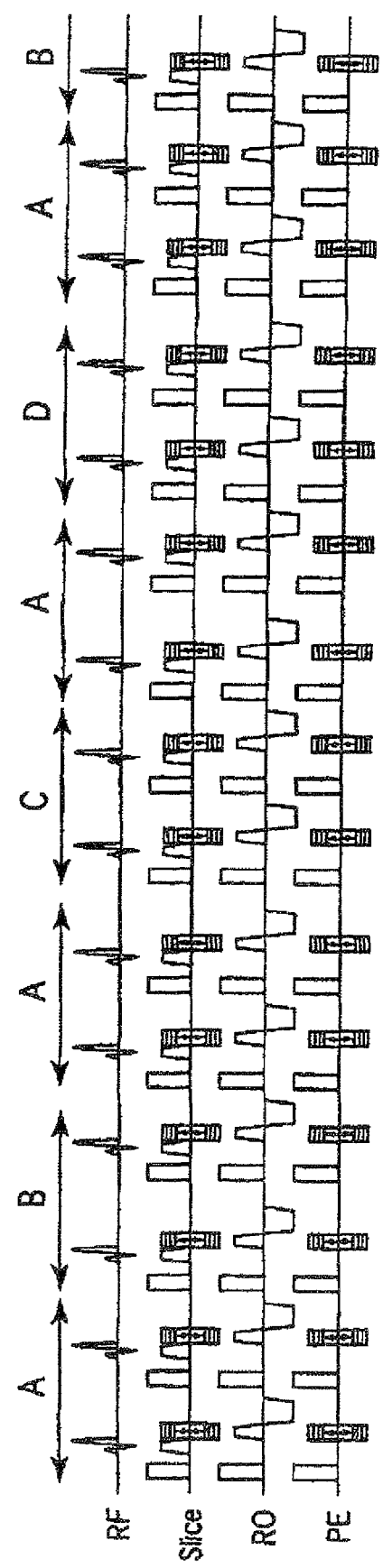
FIG. 5 is a diagram illustrating an example of a pulse sequence in a first acquisition pattern.

FIG. 4 is a diagram illustrating an example where k space is divided for double (2.0) speed-up DRKS. FIG. 5 is a diagram illustrating an example of a pulse sequence in the first acquisition pattern.

Since the speed-up rate is 2, k space is divided into four acquisition areas A, B, C, and D, as shown in FIG. 4. Acquisition areas A, B, C, and D are set using three concentric circles centered on the center of k space as boundaries perpendicular to the frequency encoding direction. Each acquisition area extends in the frequency encoding direction (in the depth direction of FIG. 4). The acquisition areas are typically set to have the same amount of data included therein, but the amount of data may be different.

As shown in FIG. 5, data of acquisition area A including the center of k space is first acquired. Thereafter, data of acquisition area B, acquisition area A, acquisition area C, acquisition area A, and acquisition area D are repeatedly acquired using this order as a cycle. Therefore, in the first acquisition pattern, the data acquisition frequency of acquisition area A is four times greater than that of acquisition areas B, C, and D.

In general, each acquisition area includes three or more data-arranging positions. Data on one data-arranging position is collected on the basis of one RF excitation. However, in FIG. 5, a part of the pulse sequence is not shown, and only the sequence for acquiring data on two data-arranging positions is shown regarding one data acquisition of one acquisition area.

In the state where the data is acquired in this way, the host computer 16 waits in steps Sa3 and Sa4 until the imaging period has ended or the data acquisition of one acquisition area has ended.

When the data acquisition of one acquisition area has ended, the host computer 16 performs the process of step Sa5 after step Sa4. In step Sa5, the host computer 16 instructs the calculation unit 11 and the display unit 13 to reconstruct an image, to form a differential image, and to display the image. In response to this instruction, the calculation unit 11 reconstructs an image of the sample 200 on the basis of the newest data of the acquisition areas. The calculation unit 11 forms a differential image between a reference image, which is set as one of a previously reconstructed image and a previously formed differential image, and the newly reconstructed image. When the previously reconstructed image is used as the reference image, it can be considered that an image reconstructed just after starting the imaging, an image reconstructed a predetermined time ago before the current time, or an image having a predetermined change is used as the reference image. The display unit 13 displays at least one of the image reconstructed by the calculation unit 11 and the differential image.

In step Sa6, the host computer 16 checks whether the change of pattern is set to ON. When it is determined that the change of pattern is set to ON, the host computer 16 performs the process of step Sa7 after step Sa6. In step Sa1, the host computer 16 checks whether the time phase to change the acquisition pattern has been input. When it is determined that the time phase to change the acquisition pattern comes in, the host computer 16 performs the process of step Sa8 after step Sa7. In step Sa8, the host computer 16 instructs the sequencer 10 and the calculation unit 11 to change the acquisition pattern to a second acquisition pattern in response to this instruction, the sequencer 10 and the calculation unit 11 change the current data acquisition pattern to the second acquisition pattern which is predetermined.

In this embodiment, the first acquisition pattern and the second acquisition pattern are equal to each other in the acquisition areas. The first acquisition pattern and the second acquisition pattern are different from each other in the data acquisition order of the acquisition areas.

Figure 6:
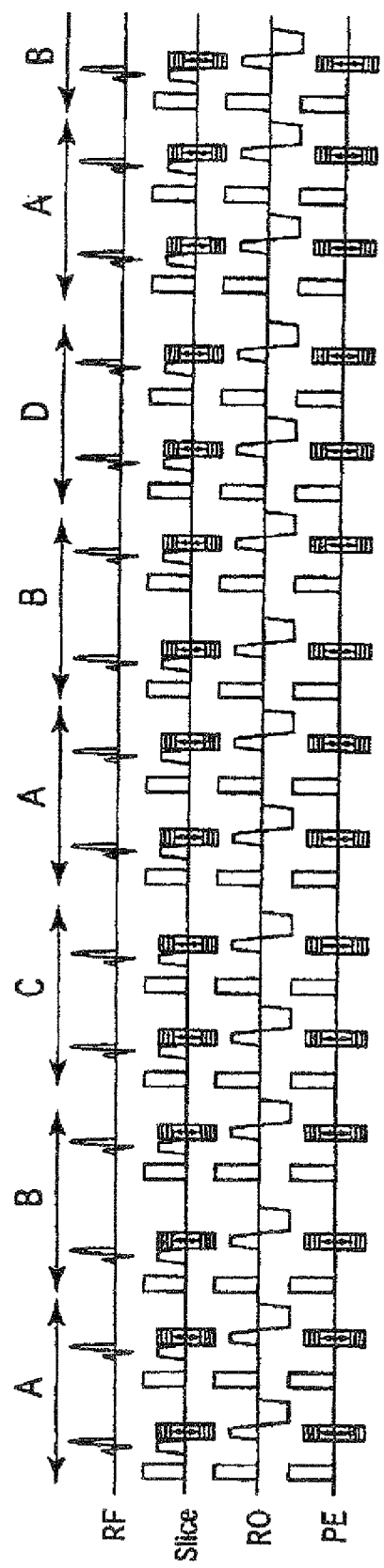
FIG. 6 is a diagram illustrating an example of a pulse sequence in a second acquisition pattern.

FIG. 6 is a diagram illustrating an example of a pulse sequence in the second acquisition pattern. In FIG. 6, a part of the pulse sequence is not shown, similarly to FIG. 5.

In the example shown in FIG. 6, the data of acquisition area A is first acquired. Thereafter, data of acquisition area B, acquisition area C, acquisition area A, acquisition area B, and acquisition area D are repeatedly acquired using this order as a cycle. Therefore, in the second acquisition pattern, the data acquisition of acquisition area B is necessarily carried out subsequently to the data acquisition of acquisition area A. The data acquisition frequency of acquisition areas A and B is two times greater than that of acquisition areas C and D.

When it is determined in step Sa6 that the charge of the pattern is set to OFF, when it is determined in step Sa7b that the time phase to change the acquisition pattern does not come in, or when the instruction is finished in step Sa8, the host computer 16 returns to the waiting state of steps Sa3 and Sa4.

When the imaging period has ended in the waiting state of steps Sa3 and Sa4, the host computer 16 performs the process of step Sa9 after step Sa3. The time point of ending the imaging period may be determined in advance or may be set to the time point when the end instruction is given by a user. In step Sa9, the host computer 16 instructs the sequencer 10 and the calculation unit 11 to end the data acquisition. Then, the host computer 16 ends the flow of processes shown in FIG. 2.

According to the above-mentioned embodiment, the data acquisition frequencies of the acquisition areas are changed and the data acquisition frequencies of the frequency components are changed, in the course of carrying out a dynamic imaging operation. Therefore, a first imaging state where the temporal resolution and the contrast have priority and a second imaging state where the structure expression precision has higher priority than the first imaging state can be switched in the course of carrying out the dynamic imaging operation. Specifically, in the first acquisition pattern, since the data of the low-frequency component is acquired more frequently than the data of the intermediate-frequency component and the high-frequency component, the temporal resolution and the contrast have priority. On the other hand, in the second acquisition pattern, since the data acquisition frequency of the intermediate-frequency component and the high-frequency component is higher than that in the first acquisition pattern, the structure expression precision has higher priority than that of the first acquisition pattern. Therefore, when the change of the data acquisition pattern is set to ON, the dynamic imaging operation is carried out so that the temporal resolution and the contrast in the first acquisition pattern have priority before the designated time phase and that the structure expression precision of the second acquisition pattern has a higher priority than that of the first acquisition pattern after the designated time phase. Accordingly, when the user properly sets the time phase to change the data acquisition pattern in consideration of the time taken for the contrast agent to arrive at the site of interest of the sample 200, it is possible to express the state where the contrast agent flows to the site of interest of the sample 200 with a high temporal resolution and high contrast and then to express the state of the contrast agent flowing to fine blood vessels with high precision.

According to this embodiment, since the user can arbitrarily turn the change in the data acquisition pattern on and off, it is possible to selectively perform known contrast MRA imaging operations employing DRKS and contrast MRA imaging operation according to the invention.

According to this embodiment, since a user can set the time point to change the data acquisition pattern, it is possible to change the data acquisition pattern at a proper time point without influencing the conditions such as a difference in position of the site of interest.

This embodiment can be modified in the following various forms.

FIRST MODIFIED EXAMPLE

In the first acquisition pattern and the second acquisition pattern, the sizes of the acquisition areas may be changed instead of changing the data acquisition order of the acquisition areas.

Figure 7:
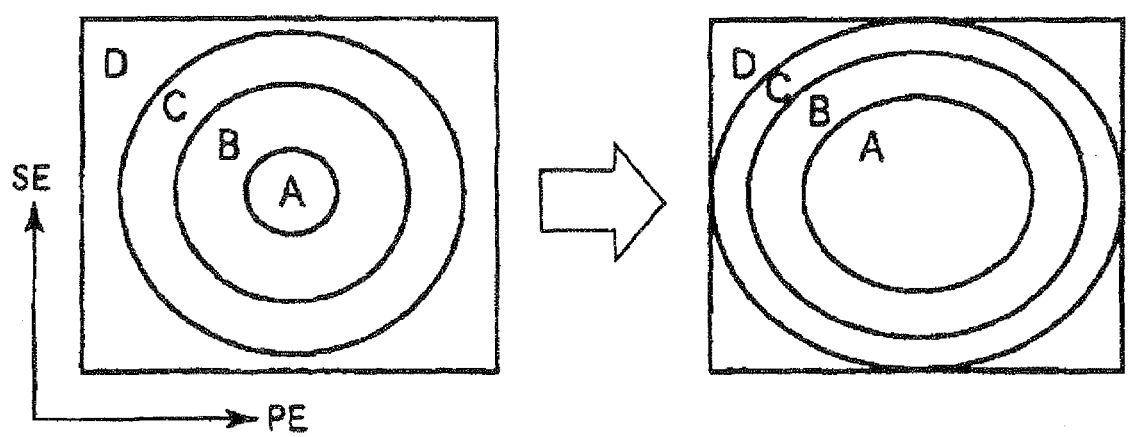
FIG. 7 is a diagram illustrating an example where the first acquisition pattern and the second acquisition pattern are different from each other in the sizes of acquisition areas.
Figure 8:
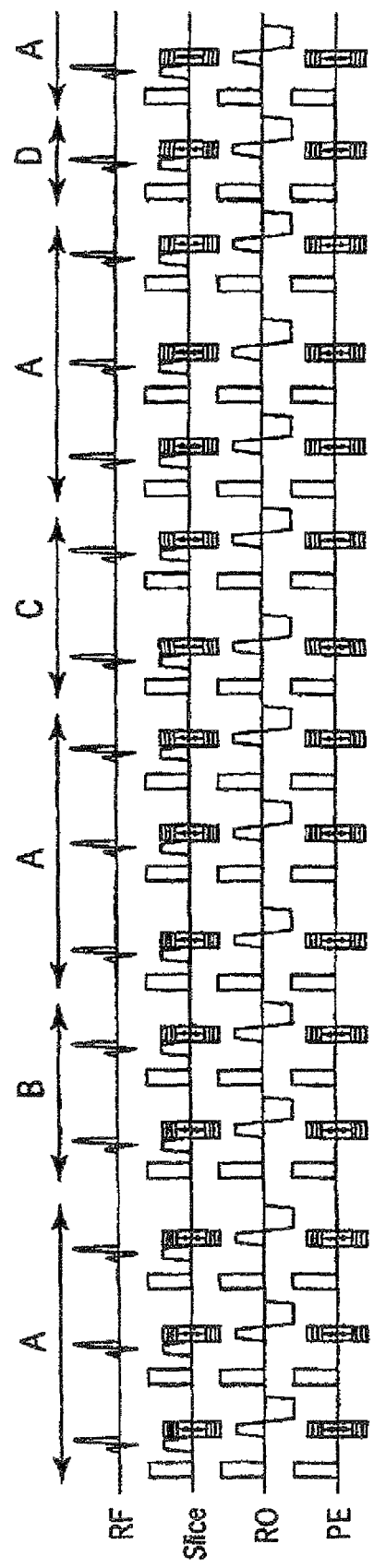
FIG. 8 is a diagram illustrating an example of a pulse sequence in a second acquisition pattern according to a first modified example.

FIG. 7 is a diagram illustrating an example where the first acquisition pattern and the second acquisition pattern are different from each other in the sizes of their acquisition areas. FIG. 8 is a diagram illustrating an example of a pulse sequence in the second acquisition pattern according to a first modified example.

The acquisition areas in the first acquisition pattern are the same as the above-mentioned embodiment and the pulse sequence shown in FIG. 5 is applied without any change. On the contrary, in the second acquisition pattern, acquisition area A is enlarged and acquisition area D is reduced. The amounts of data of acquisition area B and acquisition area C are not changed in the first acquisition pattern and the second acquisition pattern, but the positions thereof are changed toward the outer edge of the k space with the enlargement of acquisition area A. As shown in FIG. 8, the second acquisition pattern is equal to the first acquisition pattern, in that the data of acquisition area A, acquisition area B, acquisition area A, acquisition area C, acquisition area A, and acquisition area D are repeatedly acquired using this order as a cycle. However, since the sizes of the acquisition area A and acquisition area D are changed, the acquisition period of acquisition area A in the second acquisition pattern is elongated and the acquisition period of acquisition area D is shortened, compared with the acquisition periods in the first acquisition pattern. In FIG. 8, a part of the pulse sequence is not shown similarly to FIG. 5.

Since the high-frequency components acquired from acquisition area A in the second acquisition pattern with a high frequency are more than those in the first acquisition pattern, the same advantages as the above-mentioned embodiment are obtained.

SECOND MODIFIED EXAMPLE

The speed-up rate, that is, the number of acquisition areas, may be changed in the first acquisition pattern and the second acquisition pattern.

Figure 9:
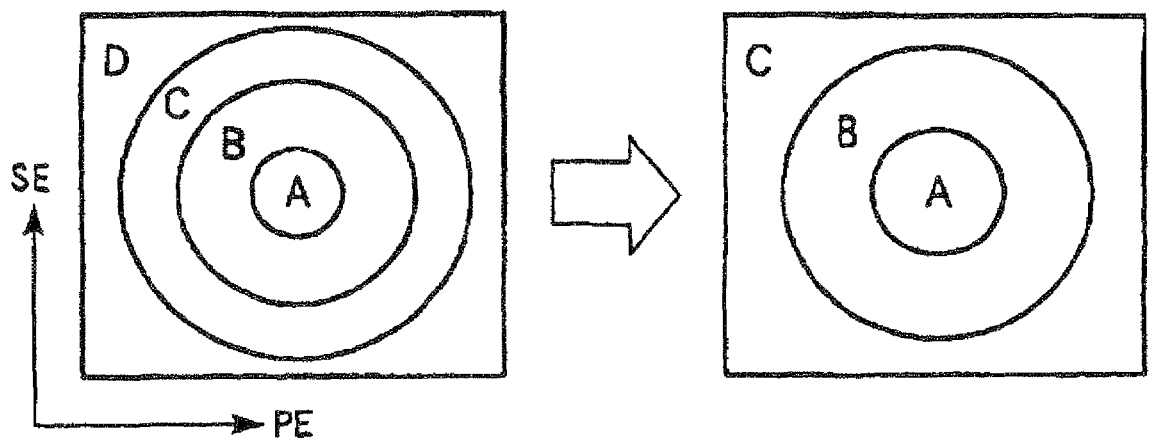
FIG. 9 is a diagram illustrating an example where the first acquisition pattern and the second acquisition pattern are different from each other in the number of acquisition areas.
Figure 10:
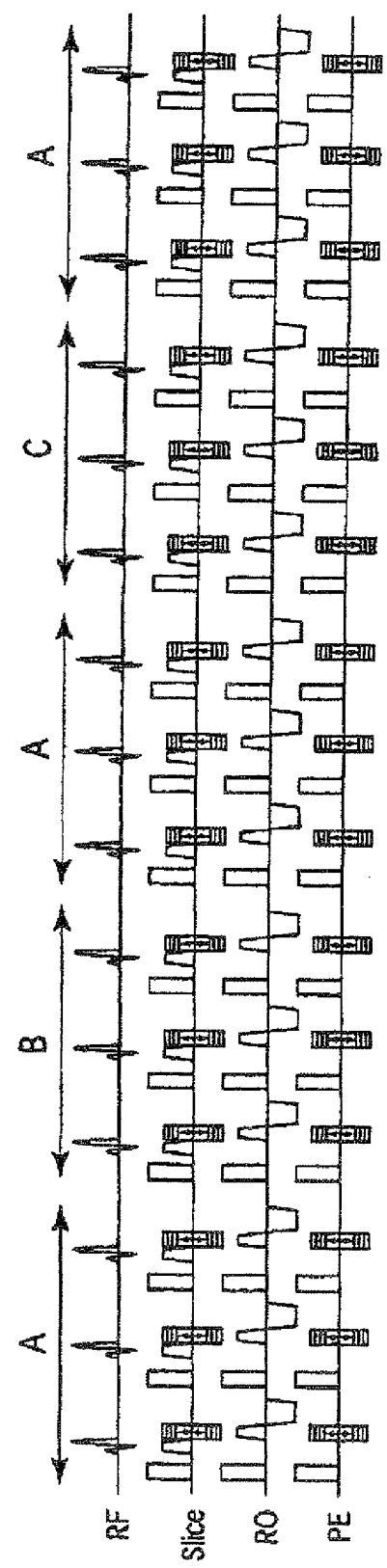
FIG. 10 is a diagram illustrating an example of a pulse sequence in a second acquisition pattern according to a second modified example.

FIG. 9 is a diagram illustrating an example where the first acquisition pattern and the second acquisition pattern are different from each other in the number of acquisition areas. FIG. 10 is a diagram illustrating an example of a pulse sequence in the second acquisition pattern according to a second modified example.

The speed-up rate in the first acquisition pattern the same as the above-mentioned embodiment and the pulse sequence shown in FIG. 5 is applied without any change. On the contrary, in the second acquisition pattern, the speed-up rate which is 2 in the first acquisition pattern is lowered to 1.5. That is, the number of the acquisition area which was 4 in the first acquisition pattern is changed to 3. Further, acquisition area A, acquisition area B, and acquisition area C in the second acquisition pattern are set using two concentric circles centered on the center of the k space as boundaries so that the amounts of data of the acquisition areas are equal. However, the amounts of data of acquisition areas A, B, and C may be different from each other.

As shown in FIG. 10, in the second acquisition pattern, the data of acquisition area A, acquisition area B, acquisition area A, and acquisition area C are repeatedly acquired using this order as a cycle. However, since the sizes of acquisition areas A, B, and C in the second acquisition pattern are greater than those of acquisition areas A, B, and C in the first acquisition pattern, respectively, the acquisition periods of acquisition areas A, B, and C in the second acquisition pattern are longer than those in the first acquisition pattern. In FIG. 10, a part of the pulse sequence is not shown similarly to FIG. 5.

Accordingly, since the high-frequency components acquired from acquisition area A in the second acquisition pattern with a high frequency are more than those in the first acquisition pattern, the same advantages as the above-mentioned embodiment are obtained.

THIRD MODIFIED EXAMPLE

The change of the acquisition pattern may be made in synchronization with the time point when a user instructs a change in the pattern.

Figure 11:
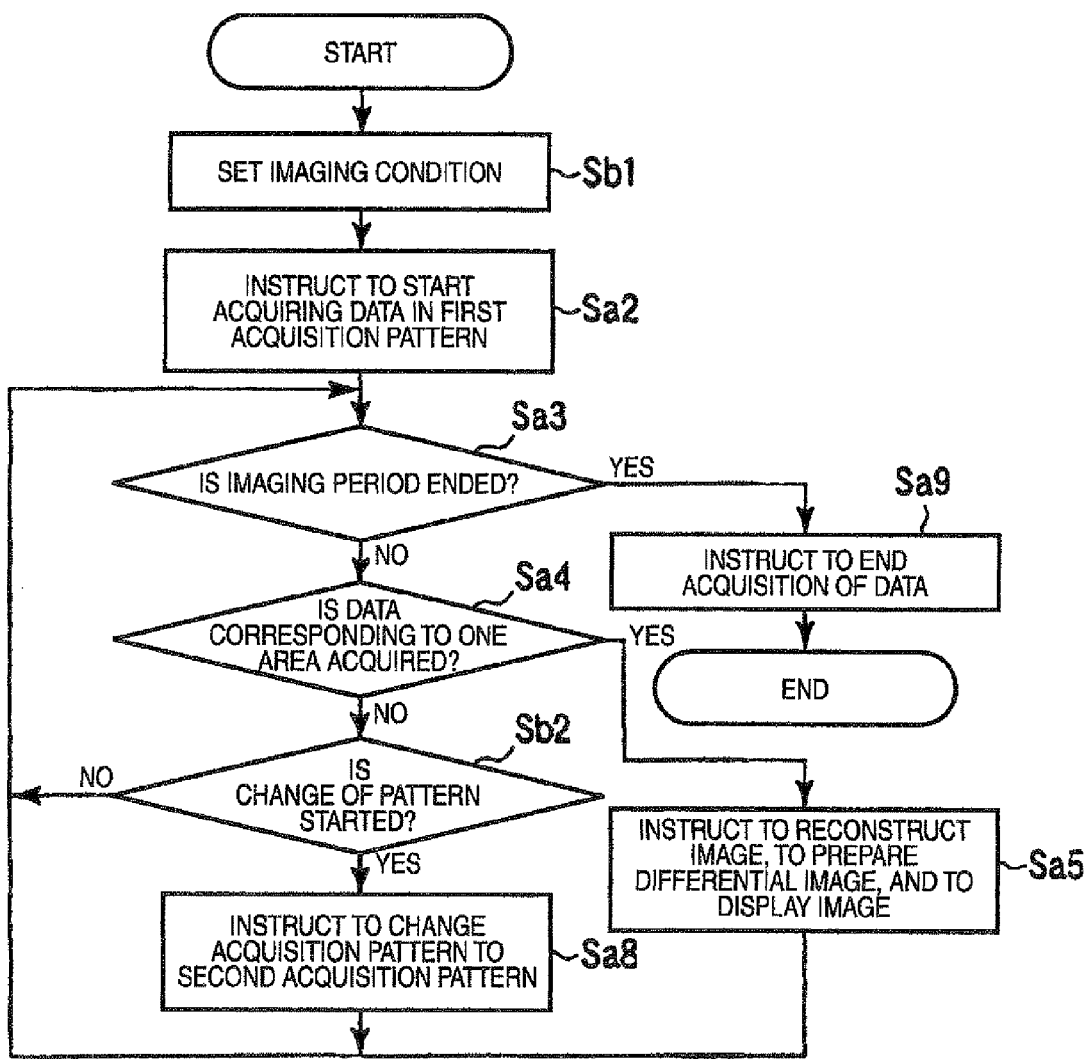
FIG. 11 is a flowchart illustrating a flow of processes performed by the host computer shown in FIG. 1 according to a third modified example.

FIG. 11 is a flowchart illustrating a flow of processes performed by the host computer 16 according to a third modified example. The same processes as shown in FIG. 2 are referenced by the same reference signs and a detailed description thereof is omitted. In the following, only operations which are not the same as the above-mentioned embodiment will be described.

The host computer 16 performs the process of step Sb1 instead of step Sa1. In step Sb1, the host computer 16 sets an imaging condition, but does not set the ON/OFF of the change in an acquisition pattern and the time phase to change the acquisition pattern.

The host computer 16 additionally waits for the pattern change instruction in step Sa2, when waiting in steps Sa3 and Sa4. In response to the pattern change instruction, the host computer 16 performs the process of step Sa8 after Sb2.

According to the third modified example, a user can give a pattern change instruction at a proper time point while observing a displayed image.

FOURTH MODIFIED EXAMPLE

The change in the acquisition pattern may be automatically made with a change in an image.

Figure 12:
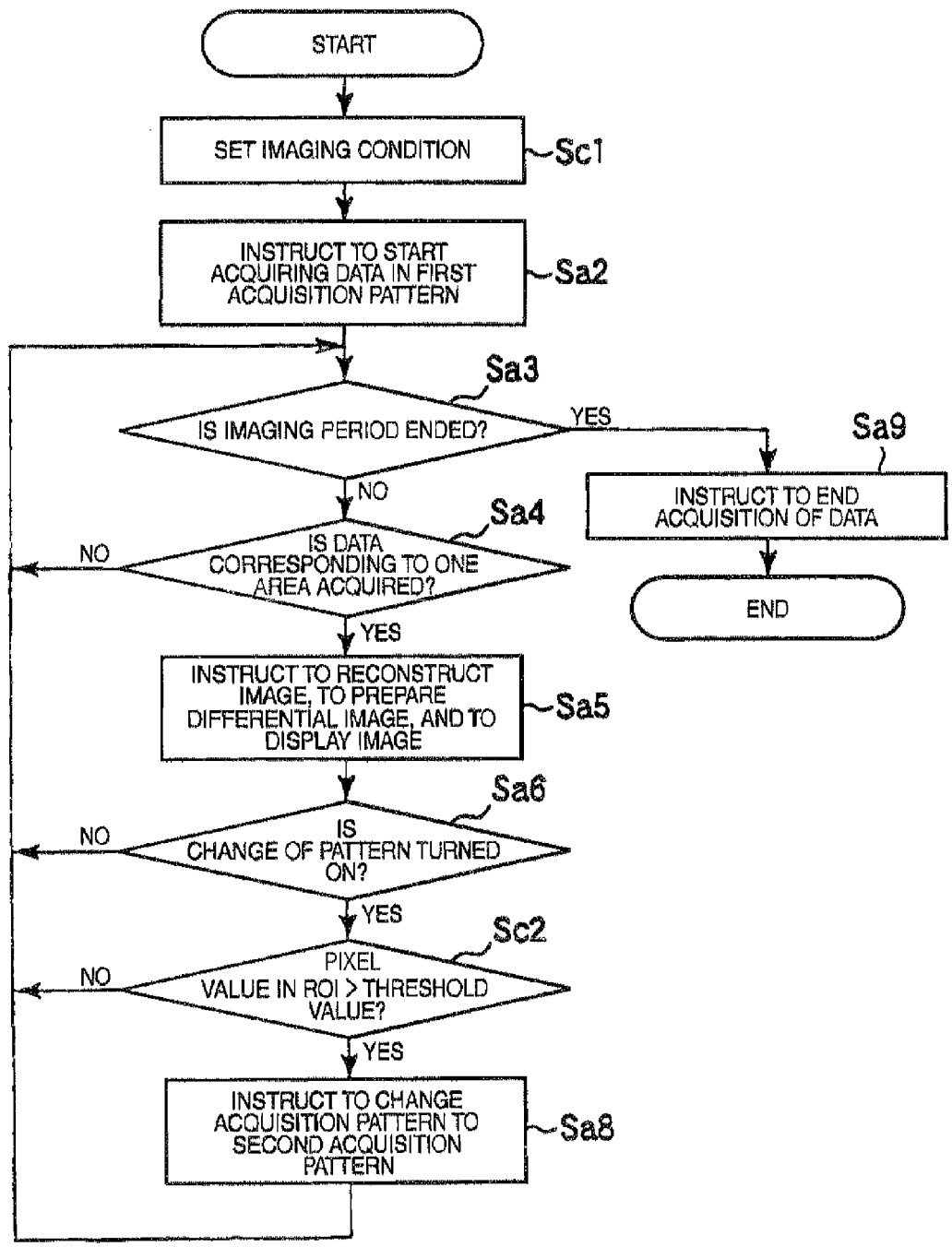
FIG. 12 is a flowchart illustrating a flow of processes performed by the host computer shown in FIG. 1 according to a fourth modified example.

FIG. 12 is a flowchart illustrating a flow of processes performed by the host computer 16 according to a Fourth modified example. The same processes as shown in FIG. 2 are referenced by the same reference signs and a detailed description thereof is omitted. In the following, only operations not the same as the above-mentioned embodiment will be described.

The host computer 16 performs the process of step Sc1 instead of step Sa1. In step Sc1, the host computer 16 sets the imaging condition, does not set the time phase to change the acquisition pattern, and sets the region of interest (hereinafter, referred to as "ROI").

The host computer 16 performs the process of step Sc2 instead of step Sa7. In step Sc2, the host computer 16 checks whether a pixel value in the ROI of the image newest reconstructed in step Sa5 or the differential image newest generated in step Sa5 is equal to or greater than a threshold value. When plural pixels are included in the ROI, the average or the maximum of the pixel values thereof can be set as the pixel value in the ROI. When the pixel value in the ROI is equal to or greater than the threshold value, the host computer 16 performs the process of step Sa8 after step Sc2.

Accordingly, according to the fourth modified example, it is possible to change the acquisition pattern at a proper time point synchronized with the actual arrival of the contrast agent at the site of interest.

FIFTH MODIFIED EXAMPLE

The technique, which is disclosed in U.S. Pat. No. 6,914,429, of changing a pre-pulse application rate in a Swirl method depending on the acquisition area may be used together with the above-mentioned embodiment.

Figure 13:
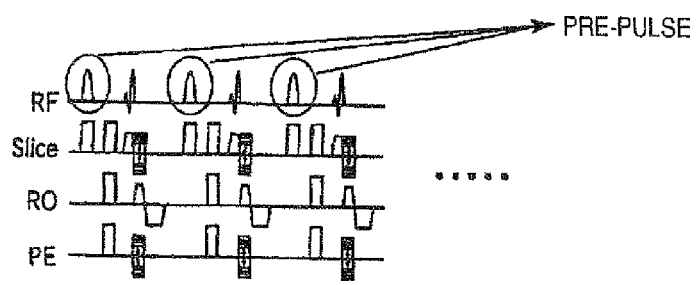
FIG. 13 is a diagram illustrating a pulse sequence for the acquisition areas in the technique disclosed in JP-A-2004-24783.
Figure 14:
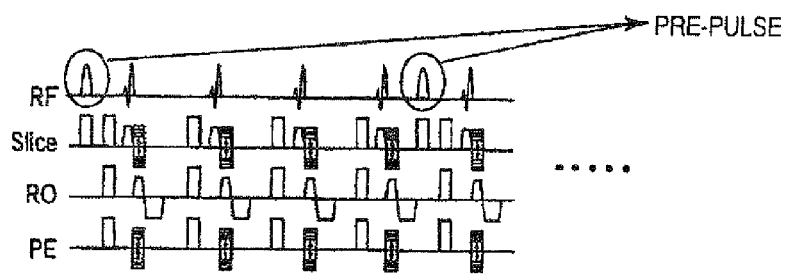
FIG. 14 is a diagram illustrating a pulse sequence for the acquisition areas in the technique disclosed in JP-A-2004-24783.
Figure 15:
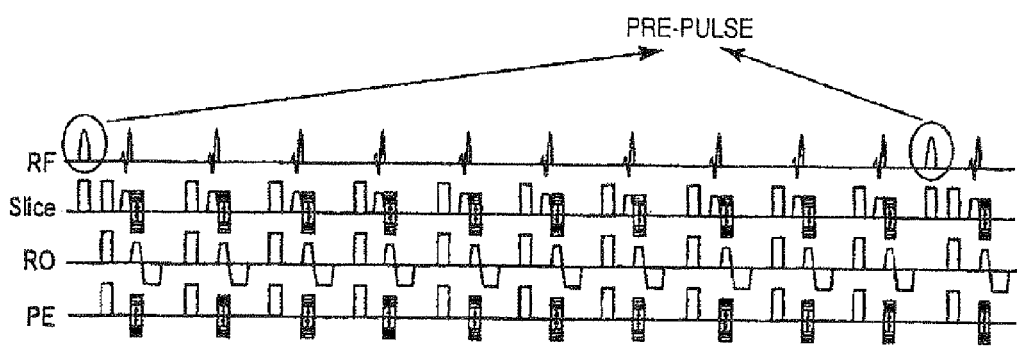
FIG. 15 is a diagram illustrating a pulse sequence for the acquisition areas in the technique disclosed in JP-A-2004-24783.

FIGS. 13 to 15 are diagrams illustrating the pulse sequences of three acquisition areas in the technique disclosed in U.S. Pat. No. 6,914,429. FIGS. 13, 14, and 15 show the acquisition areas located in the inside, the intermediate, and the outside out of three acquisition areas, respectively.

As shown in FIGS. 13 to 15, in the technique disclosed in U.S. Pat. No. 6,914,429, the pre-pulse application rate by the RF excitation becomes greater as the acquisition area becomes closer to the inside.

This application of a pre-pulse can be performed in the above-mentioned embodiment.

The pre-pulse application rate may be set to be different depending on plural areas set regardless of the acquisition areas. The areas for determining the pre-pulse application rate may be fixed regardless of the change of the acquisition areas or may be changed in synchronization with the change of the acquisition areas. When the areas for determining the pre-pulse application rate are fixed regardless of the change of the acquisition areas, the areas for determining the pre-pulse application rate may be equal to one of the acquisition areas of plural patterns. That is, the areas for determining the pre-pulse application rate may be always, for example, the areas shown in FIG. 4. When the areas for determining the pre-pulse application rate are changed in synchronization with the change of the acquisition areas, a part of the areas of plural patterns for determining the pre-pulse application rate may be equal to a part of the acquisition areas of plural patterns.

SIXTH MODIFIED EXAMPLE

In the above-mentioned embodiment, when the first acquisition pattern is changed to the second acquisition pattern, the temporal resolution is lowered. To compensate for the lowering, the well-known parallel imaging may be used together.

SEVENTH MODIFIED EXAMPLE

Three or more acquisition patterns may be prepared and the change of the acquisition pattern may be made by two steps or more.

EIGHTH MODIFIED EXAMPLE

The division type of the k space for setting the acquisition areas can be arbitrarily changed. For example, the k space may be divided at the boundaries of rectangles.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging system comprising:
acquisition means for acquiring magnetic resonance signal data of an object by dynamic imaging of the object;
reconstruction means for repeatedly reconstructing an image of the object based on data acquired and arranged in k space by the acquisition means; and
control means for controlling the acquisition means to perform the acquisition in a first period of the dynamic imaging in accordance with a first acquisition pattern set so that an acquisition frequency of the data becomes higher at a center of k space than at an outer periphery of k space, and to perform the acquisition in a second period of the dynamic imaging in accordance with a second acquisition pattern which is set so that an acquisition frequency of the data becomes higher at a center of k space than at an outer periphery of k space, and which is different from the first acquisition pattern.

2. The magnetic resonance imaging system according to claim 1, wherein the acquisition means successively acquires the data to be arranged in said first acquisition pattern, and
wherein a plurality of acquisition patterns are equal to each other in the divided k space acquisition areas but are different from each other in data acquisition order of the plurality of acquisition areas.

3. The magnetic resonance imaging system according to claim 1, wherein the acquisition means successively acquires the data to be arranged in said first acquisition pattern, and
wherein a plurality of acquisition patterns are equal to each other in data acquisition order but at least one of which is different from others in size.

4. The magnetic resonance imaging system according to claim 1, wherein the acquisition means successively acquires the data to be arranged in said first acquisition pattern, and
wherein a plurality of acquisition patterns are different from each other in a number of acquisition areas in k space.

5. The magnetic resonance imaging system according to claim 1, wherein the control means changes an acquisition pattern used by the acquisition means at a time designated by a user before starting the imaging period.

6. The magnetic resonance imaging system according to claim 1, wherein the control means changes the acquisition pattern used by the acquisition means on the basis of an instruction of change from a user.

7. The magnetic resonance imaging system according to claim 1, further comprising:
generation means for generating a differential image between a newest image newly reconstructed by the reconstruction means and a reference image determined out of previous images reconstructed by the reconstruction means prior to the newest image.

8. The magnetic resonance imaging system according to claim 1, wherein the control means changes an acquisition pattern used by the acquisition means on the basis of a change in pixel value in a predetermined region of interest of the image reconstructed by the reconstruction means or a differential image generated by the generation means.

9. A magnetic resonance imaging method comprising:
acquiring magnetic resonance signal data of an object by dynamic imaging of the object;
repeatedly reconstructing an image of the object based on the acquired data arranged in k space; and
controlling the acquisition of the data so as to perform the acquisition in a first period of the dynamic imaging in accordance with a first acquisition pattern set so that an acquisition frequency of the data becomes higher at a center of k space than at an outer periphery of k space, and to perform the acquisition in a second period of the dynamic imaging in accordance with a second acquisition pattern which is set so that an acquisition frequency of the data becomes higher at a center of k space than at an outer periphery of k space, and which is different from the first acquisition pattern.

10. A magnetic resonance imaging (MRI) method as in claim 9, wherein the data to be arranged in said first acquisition pattern is successively acquired, and
wherein a plurality of acquisition patterns are equal to each other in divided k space acquisition areas but different from each other in data acquisition order.

11. A magnetic resonance imaging (MRI) method as in claim 9, wherein the data to be arranged in said first acquisition pattern is successively acquired, and
wherein a plurality of acquisition patterns are equal to each other in data acquisition order but with at least one pattern being different from others in size.

12. A magnetic resonance imaging (MRI) method as in claim 9, wherein the data to be arranged in said first acquisition pattern is successively acquired, and
wherein a plurality of acquisition patterns are different from each other in a number of acquisition areas in k space.

13. A magnetic resonance imaging (MRI) system comprising:
an MRI gantry having static and gradient magnets and at least one radio frequency (RF) coil configured to define an MRI object imaging volume and an MRI control sub-system having at least one processor coupled to non-transitory digital data memory and configured to effect:
acquisition of MRI signal data from an object by dynamic MR imaging of the object; and
repeated reconstruction of an image of the object based on acquired data arranged in k space;
wherein said data acquisition is performed (a) in a first period of dynamic imaging in accordance with a first acquisition pattern set so that an acquisition frequency of the data becomes higher at a center of k space than at an outer periphery of k space, and (b) in a second period of dynamic imaging in accordance with a second acquisition pattern which is set so that an acquisition frequency of the data also becomes higher at a center of k space than at an outer periphery of k space, but which is different from the first acquisition pattern.

14. The magnetic resonance imaging (MRI) system according to claim 13, wherein the data to be arranged in said first acquisition pattern is successively acquired, and
wherein a plurality of acquisition patterns are equal to each other in divided k space acquisition areas but different from each other in data acquisition order.

15. The magnetic resonance imaging (MRI) system according to claim 13, wherein the data to be arranged in said first acquisition pattern is successively acquired, and
wherein a plurality of acquisition patterns are equal to each other in data acquisition order but with at least one pattern being different from others in size.

16. The magnetic resonance imaging (MRI) system according to claim 13, wherein the data to be arranged in said first acquisition pattern is successively acquired, and
wherein a plurality of acquisition patterns are different from each other in a number of acquisition areas in k space.

17. The magnetic resonance imaging (MRI) system according to claim 13, wherein an acquisition pattern is changed at a time designated by a user before starting the imaging period.

18. The magnetic resonance imaging (MRI) system according to claim 13, wherein an acquisition pattern changes on the basis of an instruction of change input from a user.

19. The magnetic resonance imaging (MRI) system according to claim 13, wherein said at least one processor is further configured to effect:
generation of a differential image between a newest image newly reconstructed and a reference image determined out of previous images reconstructed prior to the newest image.

20. The magnetic resonance imaging (MRI) system according to claim 13, wherein an acquisition pattern is changed on the basis of (a) a change in pixel value in a predetermined region of interest of the reconstructed image (b) or a generated differential image.

* * * * *